(12) United States Patent  
Fogel et al.

(10) Patent No.: US 8,735,210 B2
(45) Date of Patent: May 27, 2014

(54) HIGH EFFICIENCY SOLAR CELLS FABRICATED BY INEXPENSIVE PECVD

(75) Inventors: Keith E. Fogel, Hopewell Junction, NY (US); Augustin J. Hong, White Plains, NY (US); Jeehwan Kim, Los Angeles, CA (US); Devendra K. Sadana, Pleasantville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/535,812

(22) Filed: Jun. 28, 2012

(65) Prior Publication Data

US 2014/0004651 A1 Jan. 2, 2014

(51) Int. Cl.
  *H01L 21/00* (2006.01)
(52) U.S. Cl.
  USPC .............................. 438/87; 257/434
(58) Field of Classification Search
  USPC ........................... 257/434; 438/87
  See application file for complete search history.

(56) References Cited

U.S. PATENT DOCUMENTS

| | | | |
|---|---|---|---|
| 4,532,537 A | 7/1985 | Kane | |
| 5,133,986 A * | 7/1992 | Blum et al. | 427/569 |
| 5,403,771 A * | 4/1995 | Nishida et al. | 438/97 |
| 5,565,036 A * | 10/1996 | Westendorp et al. | 118/723 MP |
| 6,124,545 A | 9/2000 | Bauer et al. | |
| 6,339,013 B1 * | 1/2002 | Naseem et al. | 438/491 |
| 6,383,576 B1 | 5/2002 | Matsuyama | |
| 6,700,057 B2 | 3/2004 | Yasuno | |
| 7,122,736 B2 | 10/2006 | Wang et al. | |
| 7,196,262 B2 * | 3/2007 | Gronet | 136/246 |
| 7,399,654 B2 | 7/2008 | Lin et al. | |
| 7,446,023 B2 * | 11/2008 | Joshi et al. | 438/475 |
| 7,645,495 B2 * | 1/2010 | Dings et al. | 427/569 |
| 7,998,863 B2 * | 8/2011 | Wenham et al. | 438/675 |
| 8,049,102 B1 | 11/2011 | Lee et al. | |
| 8,110,246 B2 * | 2/2012 | Klein et al. | 427/74 |
| 8,283,559 B2 * | 10/2012 | Yu et al. | 136/255 |
| 8,309,389 B1 * | 11/2012 | Alie et al. | 438/71 |
| 8,357,242 B2 * | 1/2013 | Jewett et al. | 117/88 |
| 8,481,419 B2 * | 7/2013 | Horzel et al. | 438/614 |
| 8,552,558 B2 * | 10/2013 | Carroll et al. | 257/741 |
| 2005/0189015 A1 * | 9/2005 | Rohatgi et al. | 136/261 |
| 2006/0207644 A1 | 9/2006 | Robinson et al. | |
| 2006/0283496 A1 * | 12/2006 | Okamoto et al. | 136/244 |
| 2007/0202636 A1 * | 8/2007 | Choi | 438/149 |
| 2008/0096305 A1 | 4/2008 | Takai et al. | |
| 2008/0138966 A1 * | 6/2008 | Rogojina et al. | 438/502 |
| 2008/0173349 A1 * | 7/2008 | Liu et al. | 136/256 |
| 2009/0017601 A1 * | 1/2009 | Jewett et al. | 438/478 |

(Continued)

OTHER PUBLICATIONS

Li, T. "The Manufacturing of SI Base Thin Film Solar Cell Modules" ASICON2011. 2011 IEEE. Oct. 2011. pp. 461-465.

(Continued)

*Primary Examiner* — Kimberly Rizkallah
*Assistant Examiner* — Caleb Henry
(74) *Attorney, Agent, or Firm* — Tutunjian & Bitetto, P.C.; Louis J. Percello

(57) ABSTRACT

A method for forming a photovoltaic device includes depositing one or more layers of a photovoltaic stack on a substrate by employing a high deposition rate plasma enhanced chemical vapor deposition (HDR PECVD) process. Contacts are formed on the photovoltaic stack to provide a photovoltaic cell. Annealing is performed on the photovoltaic cell at a temperature and duration configured to improve overall performance.

23 Claims, 3 Drawing Sheets

(56) References Cited

U.S. PATENT DOCUMENTS

| | | | |
|---|---|---|---|
| 2009/0056805 A1* | 3/2009 | Barnett et al. | 136/256 |
| 2009/0101199 A1* | 4/2009 | Carroll et al. | 136/252 |
| 2009/0275210 A1* | 11/2009 | Shanker et al. | 438/761 |
| 2010/0233840 A1* | 9/2010 | Rohatgi et al. | 438/72 |
| 2010/0313932 A1* | 12/2010 | Kroll et al. | 136/244 |
| 2011/0045631 A1* | 2/2011 | Ji et al. | 438/98 |
| 2011/0079281 A1 | 4/2011 | Reuter et al. | |
| 2011/0136285 A1* | 6/2011 | Kim | 438/57 |
| 2011/0186127 A1 | 8/2011 | Benagli et al. | |
| 2011/0303283 A1 | 12/2011 | Chang et al. | |
| 2013/0078757 A1 | 3/2013 | Foust et al. | |

OTHER PUBLICATIONS

Rech, B., et al. Amorphous and Microcrystalline Silicon Solar Cells Prepared at High Deposition Rates Using RF (13.56 MHZ) Plasma Excitation Frequencies. Solar Energy Materials and Solar Cells, vol. 66, No. 1. Feb. 2001. pp. 267-273.

Suzuki, S., et al. "Growth of Device Grade UC-SI Film at Over 50 A/S Using PECVD" Solar Energy Materials and Solar Cells, vol. 74, No. 1. Oct. 2002. pp. 489-495.

Terasa, R., et al. "PECVD of Doped and Intrinsic A-SI:H Layers for Solar Cell Structures Using a (Novel) Inline Deposition System" 2005 IEEE. Photovoltaic Specialists, IEEE Conference—PVSC. Jan. 2005. pp. 1528-1531.

Van Aken, B., et al. "PECVD Deposition of A-SI:H and UC-SI:H Using a Linear RF Srouce" Proc. of SPIE, vol. 6651. Sep. 2007. pp. 1-8.

Patent Cooperation Treaty. "Notification of Transmittal of the International Search Report and the Written Opinion of the International Searching Authority, or the Declaration" Issued for PCT/US13/47475 on Jun. 25, 2013. (12 Pages).

* cited by examiner

HIGH EFFICIENCY SOLAR CELLS FABRICATED BY INEXPENSIVE PECVD

BACKGROUND

1. Technical Field

The present invention relates to photovoltaic devices and methods for fabrication, and more particularly to systems, devices and fabrication methods that improve efficiency for devices fabricated with inexpensive deposition tools.

2. Description of the Related Art

With the push for more efficient and cheaper solar energy, higher throughput and lower expense tools are needed for producing solar panels. Conventional solar panel production typically relies of plasma enhanced chemical vapor deposition tools that require ultra high vacuum and low deposition rates (e.g., 1 angstrom/sec) in order to achieve sufficient quality. Such processes are marked by low plasma power (to reduce cost and protect the device being fabricated) and low gas pressure. These processes result in low productivity and stand in the way of the impetus to further solar power as a long term energy solution.

SUMMARY

A method for forming a photovoltaic device includes depositing one or more layers of a photovoltaic stack on a substrate by employing a high deposition rate plasma enhanced chemical vapor deposition (HDR PECVD) process. Contacts are formed on the photovoltaic stack to provide a photovoltaic cell. Annealing is performed on the photovoltaic cell at a temperature and duration configured to improve overall performance.

Another method for forming a photovoltaic device includes depositing a p-type layer on a transparent electrode of a transparent substrate; depositing an intrinsic layer on the p-type layer; depositing an n-type layer on intrinsic layer, wherein at least the p-type layer, the intrinsic layer and the n-type layer are deposited by employing a high deposition rate plasma enhanced chemical vapor deposition (HDR PECVD) process to form a photovoltaic stack on the substrate; forming a contacts on the n-type layer photovoltaic stack to provide a photovoltaic cell; and annealing the photovoltaic cell at a temperature of between about 155 and 250 degrees Celsius to improve overall performance.

Yet another method for forming a photovoltaic device includes depositing a buffer layer on a transparent electrode of a transparent substrate; depositing a p-type layer on the buffer layer; depositing an intrinsic layer on the p-type layer; depositing an n-type layer on the intrinsic layer, wherein at least the p-type layer, the buffer layer, the intrinsic layer and the n-type layer are deposited by employing a high deposition rate plasma enhanced chemical vapor deposition (HDR PECVD) process to form a photovoltaic stack on the substrate, the HDR PECVD process including a deposition rate of 3 angstroms per second or greater at a vacuum pressure of between about 1 mTorr and about 90 mTorr; forming a contact on the n-type layer photovoltaic stack to provide a photovoltaic cell; and annealing the photovoltaic cell at a temperature of between about 155 and 250 degrees Celsius for a duration of between about 5 minutes and about 10 minutes to improve overall performance.

A photovoltaic device includes one or more layers of a photovoltaic stack formed on a substrate by employing a high deposition rate plasma enhanced chemical vapor deposition (HDR PECVD) process. Contacts are formed on the photovoltaic stack to provide a photovoltaic cell. Reduced defect zones are disposed adjacent to contact regions in portions of the photovoltaic cell and are formed by an anneal configured to improve overall performance. The anneal included a temperature of between about 155 degrees Celsius and about 250 degrees Celsius to render the reduced defect zones more conductive.

Another photovoltaic device includes a p-type layer formed on a transparent electrode of a transparent substrate, an intrinsic layer formed on the p-type layer, and an n-type layer formed on intrinsic layer, wherein at least the p-type layer, the intrinsic layer and the n-type layer are formed by a high deposition rate plasma enhanced chemical vapor deposition (HDR PECVD) process. A contact is formed on the n-type layer. Reduced defect zones are disposed adjacent to the contact in the n-type layer and adjacent to the transparent electrode in the p-type layer and formed by an anneal configured to improve overall performance. The anneal includes a temperature of between about 155 degrees Celsius and about 250 degrees Celsius.

Yet another photovoltaic device includes a buffer layer formed on a transparent electrode of a transparent substrate, a p-type layer formed on the buffer layer, an intrinsic layer formed on the p-type layer and an n-type layer formed on the intrinsic layer, wherein at least the p-type layer, the buffer layer, the intrinsic layer and the n-type layer include characteristics of a high deposition rate plasma enhanced chemical vapor deposition (HDR PECVD) process to form a photovoltaic stack on the substrate. The HDR PECVD process includes a deposition rate of 3 angstroms per second or greater at a vacuum pressure of between about 1 mTorr and about 90 mTorr. A contact is formed on the n-type layer of the photovoltaic stack to provide a photovoltaic cell. Reduced defect zones are disposed adjacent to the contact in the n-type layer and adjacent to the transparent electrode in the buffer layer and formed by an anneal configured to improve overall performance. The anneal includes a temperature of between about 155 degrees Celsius and about 250 degrees Celsius and a duration of between about 5 minutes and about 10 minutes.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
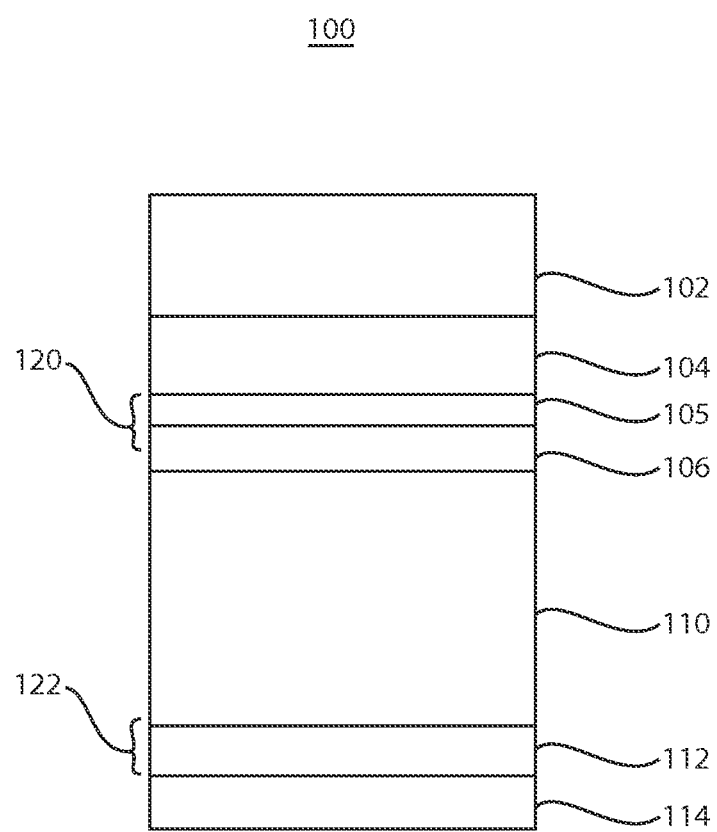
FIG. 1 is a cross-sectional view of a photovoltaic device with reduced defect zones formed in accordance with the present principles.

In accordance with the present principles, methods and devices are presented that provide improved efficiency to photovoltaic cells fabricated with high deposition rate and high throughput processes. Layers for semiconductor devices are often deposited using low deposition energies. Low deposition energies are favored by manufacturing since the low energy permits high quality a-Si:H layer deposition and less energy usage. Designers also prefer low deposition energies since the low energies create plasma with less energy bombardment on a surface resulting in less damage to existing structures on semiconductor devices. In thin film Si solar cell applications, high deposition energies are desired for depositing a p+ layer since the higher energies increase the likelihood that a microcrystalline phase will form. The microcrystalline phase can reduce barrier heights between the p+ layer and an electrode (e.g., formed from a transparent conductive oxide (TCO)).

For example, photovoltaic stacks and, in particular, p-i-n structures (a p-type layer, an intrinsic layer, an n-type layer) or n-i-p structures (an n-type layer, an intrinsic layer, a p-type layer) include layers where a band offset at an interface can be improved based upon the crystallinity of the layers—the higher power, the higher the crystallinity. Higher crystallinity permits for tunneling current through the barrier. In useful examples, such improvements can be gained at an interface between a transparent conductive oxide (TCO) to the p+ layer. A band offset at the TCO/p+ layer is unavoidable since all developed TCO films are n-type.

In particularly useful embodiments, photovoltaic devices are constructed using low cost deposition processes. These processes include a plasma enhanced chemical vapor deposition (PECVD) (hereinafter referred to as "high deposition rate PECVD" or HDR PECVD) that employ a high deposition rate and use a rough vacuum. The HDR PECVD processes increase throughput but may result in lower performance. To improve cell performance, the present inventors have discovered methods for improving the quality and the cell performance of HDR PECVD devices. By improving the cell performance of the HDR PECVD cells, all of the benefits of the HDR PECVD are made available while reducing the drawbacks.

In particularly useful embodiments, a silicon based photovoltaic device is formed. After the formation of metal contacts (e.g., electrodes), the entire device is subjected to a low temperature anneal process. The anneal process results in cell efficiency improvements of about 1-3%, which is a significant improvements in the solar industry. In accordance with the present principles, competing benefits are weighed to achieve a high throughput manufacturing process while maintaining device quality and performance.

It is to be understood that the present invention will be described in terms of a given illustrative architecture having substrates and photovoltaic stacks; however, other architectures, structures, substrates, materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A design for a photovoltaic device may be created for integrated circuit integration or may be combined with components on a printed circuit board. The circuit or board may be embodied in a graphical computer programming language, and stored in a computer storage medium (such as a disk, tape, physical hard drive, or virtual hard drive such as in a storage access network). If the designer does not fabricate chips or photovoltaic devices, the designer may transmit the resulting design by physical means (e.g., by providing a copy of the storage medium storing the design) or electronically (e.g., through the Internet), directly or indirectly.

Methods as described herein may be used in the fabrication of photovoltaic devices and/or integrated circuit chips with photovoltaic devices. The resulting devices/chips can be distributed by the fabricator in raw wafer form (that is, as a single wafer that has multiple unpackaged devices/chips), as a bare die, or in a packaged form. In the latter case the device/chip is mounted in a single chip package (such as a plastic carrier, with leads that are affixed to a motherboard or other higher level carrier) or in a multichip package (such as a ceramic carrier that has either or both surface interconnections or buried interconnections). In any case, the devices/chips are then integrated with other chips, discrete circuit elements, and/or other signal processing devices as part of either (a) an intermediate product, such as a motherboard, or (b) an end product. The end product can be any product that includes integrated circuit chips, ranging from toys, energy collectors, solar devices and other applications including computer products or devices having a display, a keyboard or other input device, and a central processor. The photovoltaic devices described herein are particularly useful for solar cells or panels employed to provide power to electronic devices, homes, buildings, vehicles, etc.

It should also be understood that material compounds will be described in terms of listed elements, e.g., SiC or SiGe. These compounds include different proportions of the elements within the compound, e.g., SiGe includes $Si_xGe_{1-x}$ where x is less than or equal to 1, etc. In addition, other elements may be included in the compound and still function in accordance with the present principles. The compounds with additional elements may be referred to herein as alloys.

The present embodiments may be part of a photovoltaic device or circuit, and the circuits as described herein may be part of a design for an integrated circuit chip, a solar cell, a light sensitive device, etc. The photovoltaic device may be a large scale device on the order of feet or meters in length and/or width, or may be a small scale device for use in calculators, solar powered lights, etc.

It is also to be understood that the present invention may include tandem (multi-junction) structures including sub-cells, which will be described in terms of a particular material. Each sub-cell includes a p-doped layer, an n-doped layer and an undoped intrinsic layer.

Referring now to the drawings in which like numerals represent the same or similar elements and initially to FIG. 1, an illustrative photovoltaic structure 100 is illustratively depicted in accordance with one embodiment. The present embodiments may be part of a photovoltaic device or circuit, and the circuits as described herein may be part of a design for an integrated circuit chip, a solar cell, a light sensitive device, etc. The photovoltaic devices described herein are preferably on a large scale on the order of feet or meters in length and/or width for use in solar power. Hence, the present principles prefer large scale devices with fabrication processes that provide higher throughput through faster deposition rates and easier processing (HDR PECVD). This may include rougher vacuum pressure in processing chambers, higher deposition rates, etc.

Structure 100 includes a substrate 102 that permits a high transmittance of light. The substrate 102 may include a transparent material, such as glass, quartz, silicon, a polymer, etc. or combinations thereof. A first electrode 104 includes a transparent conductive material. Electrode 104 may include a transparent conductive oxide (TCO), such as, e.g., a fluorine-doped tin oxide ($SnO_2$:F, or "FTO"), doped zinc oxide (e.g., ZnO:Al), indium tin oxide (ITO) or other suitable materials. For the present example, a doped zinc oxide is illustratively employed for electrode 104. The TCO 104 permits light to pass through to an active light-absorbing material beneath and allows conduction to transport photo-generated charge carriers away from that light-absorbing material. The TCO 104 may be deposited by a chemical vapor deposition (CVD) process, a low pressure CVD (LPCVD) process or a plasma-enhanced (PE-CVD) process.

A buffer layer 105 may be employed. Buffer layer 105 may include germanium or silicon germanium and may include a p-type dopant such as B, Ga, In or combinations thereof. In one embodiment, the buffer layer 105 includes a silicon-germanium alloy layer including germanium, silicon, optionally a p-type dopant, and hydrogen. In this embodiment, the atomic concentration of germanium may be greater than 50%. Depending on the work-function of TCO 104, Si content in Ge can be varied. The buffer layer 105 has a greater atomic concentration of germanium than a p-doped layer 106 formed on the buffer layer 105.

The buffer layer 105 can be amorphous, microcrystalline, or single crystalline. The buffer layer 105 may include a hydrogenated material. For example, if the buffer layer 105 includes a hydrogenated amorphous silicon germanium alloy, a hydrogenated microcrystalline silicon-germanium alloy, a hydrogenated amorphous germanium, or a hydrogenated microcrystalline germanium, the hydrogenation of the material of the buffer layer 105 decreases localized electronic states and increases the conductivity of the buffer layer 105. A hydrogenated amorphous germanium may be formed using $GeH_4$ plasma. The buffer layer 105 can be formed, for example, by the HDR PECVD process. In one embodiment, the HDR PECVD process may include a power of between about 100 mW/cm$^2$ and about 10 W/cm$^2$. The deposition temperature for either process may be maintained at between about 200 degrees C. to about 300 degrees C., although other temperatures may be employed. A high deposition rate (HDR) is provided that includes, e.g., 3-25 angstroms/sec. The buffer layer 105 better transitions band gap energies between layers.

The thickness of the buffer layer 105 can be from about 1 nm to about 10 nm, although lesser and greater thicknesses can also be employed. All the barriers, e.g., between TCO 104 and the buffer layer 105 and between the buffer layer 105 and the p+ layer 106, exist at valence band locations. One purpose of having the buffer layer 105 is to make a mid-gap bridge between TCO 104 and p+ layer 106.

The buffer layer 105 better aligns the Fermi level between the TCO layer 104 (e.g., ZnO) and the p-type layer 106 (e.g., a-SiC:H). The Fermi level of the TCO layer 104 in the case of ZnO is about 4.5 eV. Without the buffer layer 105, a larger Schottky barrier exists between the TCO 104 and the p-type layer 106. With the buffer layer 105, the Fermi levels of TCO 104 and the buffer layer 105 are well-aligned reducing the barrier offset. A conduction band between the buffer layer 105 and the p-type layer 106 is also well-aligned. In this way, the Schottky barrier is reduced or eliminated resulting in better conduction and more efficient device operation by permitting higher open circuit voltage ($V_{OC}$) without sacrificing fill factor (FF). In particularly useful embodiments, it is believed that increased crystallinity of the buffer layer 105 correlates with increased open circuit voltage ($V_{OC}$) while at least maintaining fill factor (FF).

The p-doped layer 106 may include an amorphous, microcrystalline, or single-crystalline p-doped silicon-containing material. The p-doped layer 106 can be a p-doped silicon layer including: silicon and at least one p-type dopant and optionally hydrogen; a p-doped silicon-carbon alloy layer including: silicon, carbon, at least one p-type dopant and optionally hydrogen. Other materials may also be employed.

In some cases, the p-doped layer 106 may include a hydrogenated amorphous, microcrystalline, or single-crystalline p-doped silicon-containing material. A hydrogenated p-doped silicon-containing material can be deposited in a process chamber having a silicon-containing reactant gas as a carrier gas. To facilitate incorporation of hydrogen in the hydrogenated p-doped silicon-containing material, a carrier gas including hydrogen can be employed. Hydrogen atoms in the hydrogen gas within the carrier gas are incorporated into the deposited material to form an amorphous or microcrystalline hydrogenated p-doped silicon-containing material of the p-doped layer 106.

In one embodiment, p-doped or p-type layer 106 includes boron as a dopant, although other p-type dopants may be employed. Layer 106 may be deposited using diborane gas, trimethylborane or other gases. The p-type layer 106 may have a thickness of between about 5-30 nm. In particularly useful embodiments, layer 106 includes amorphous SiC or Si. The processing of the p-type layer 106 also can affect the efficiency of the device. For example, the deposition parameters for depositing the p-type layer 106 may be selected to increase the effects of the buffer layer 105.

The p-type layer 106 can be formed, for example, by the HDR PECVD process. As with the buffer layer 105 or any other layer in the device 100, the HDR PECVD reduces costs by increasing throughput and reducing fabrication time. The HDR PECVD deposition may include a power of between about 100 mW/cm$^2$ and about 10 W/cm$^2$. The deposition temperature for the process may be maintained at between about 200 degrees C. to about 300 degrees C., although other temperatures may be employed. The thickness of the p-type layer 106 can be from about 5 nm to about 30 nm, although lesser and greater thicknesses can also be employed.

In one embodiment, the p-type layer 106 (e.g., a-SiC:H) is aligned in terms of the Fermi level with the TCO layer 104 (e.g., ZnO) or the buffer layer 105 (e.g., Ge) (if employed). Processing continues with the formation of an intrinsic layer 110 formed on layer 106 from compatible materials. Intrinsic layer 110 may be undoped and may include an amorphous silicon material, e.g., hydrogenated amorphous Si (a-Si:H). The intrinsic layer 110 may include a thickness of between about 150-350 nm, although other thicknesses are contemplated. The intrinsic layer 110 may be formed using the HDR PECVD process, e.g., from silane gas and hydrogen gas. Using the HDR PECVD process for fabricating the intrinsic layer 110 provides the greatest time savings due to the relatively large thickness of the intrinsic layer 110.

A doped layer 112 (e.g., an n-type layer) is formed on the intrinsic layer 110. Layer 112 may include an n-type Si containing layer, e.g., hydrogenated microcrystalline (μc-Si:H), single crystalline (Si) or an amorphous (a-Si) layer. Layer 112 may be deposited by the HDR PECVD process. The n-type layer 112 may have a thickness of between about 5-20 nm. A back reflector and/or bottom electrode 114 may be formed using a reflective metal, such as Ag, Al, etc. and may be combined with ZnO or other layers. A suitable metal deposition process may be employed, e.g., physical or chemical vapor deposition, sputtering, evaporation, electro or electroless plating, etc. It should be understood that other material selections, layers, structures, etc. may be employed in device 100 including additional back reflectors, etc. or instead of back reflectors: tandem cells, etc.

It should also be understood that the structures depicted in FIG. 1 are illustrative and that other structures may be employed, e.g., the p-i-n stack can be reversed (n-i-p). In addition, one or more layers of the device 100 may be formed with the HDR PECVD deposition process, while other layers may be formed using other processes.

The HDR PECVD deposition process is performed inside a vacuum chamber. The vacuum chamber employed here need not include ultrahigh vacuum pressures. Instead, in accordance with the present principles, a rough vacuum may be employed. The rough vacuum includes a pressure of between about 1 mTorr and about 90 mTorr. With this vacuum and other parameters, high deposition rates can be achieved (e.g., 3-25 angstroms/second). The characteristics of the HDR PECVD deposition process, e.g., the deposition power, vacuum, processing temperatures, etc. result in significant increases in device throughput.

It should be further understood that HDR PECVD may be employed to deposit amorphous Ge:H (a-Ge:H), amorphous Si:H (a-Si:H), microcrystalline Ge:H (μc-Ge:H), microcrystalline Si:H (μc-Si:H) for the p+, intrinsic, n+ and optional buffer layer. In addition, a-SiC:H and μc-SiC:H can be deposited by incorporating carbon gas for depositing these layers. Combinations of these materials may also be useful, e.g., a-SiGe:H, μc-SiGe:H may be deposited for the p+, intrinsic, n+ and optional buffer layer. Other materials and//or additional elements (including appropriate dopants) may be incorporated with the layers as needed or desired.

The HDR PECVD may be employed in forming all layers, one layer or any combination of layers. The HDR PECVD process may be combined with other processes (e.g., other deposition processes, wafer bonding, etc.)

In accordance with particularly useful embodiments, after the bottom electrode or contact 114 is formed, the entire structure 100 undergoes an anneal process to improve the device performance. The anneal process may include a rapid thermal anneal (RTA) and is targeted at a specific temperature range (e.g., about 155 to about 250 degrees C.) for a limited duration (e.g., about 5 minutes to about 10 minutes). The anneal is believed to cure defects and reduce contact resistance between metal electrodes to semiconductor materials. In addition, an increase in crystallinity may be achieved especially at the top and bottom layers nearest the electrodes 104 and 114 (e.g., p-type layer 106 and n-type layer 112).

Reduced defect zones 120 and 122 are disposed adjacent to the electrodes or contacts 104 and 114. The reduced defect zones 120 and 122 are densified, more crystalline and more conductive than adjacent areas of the p-type layer 106 or n-type layer 112. In one embodiment, the defect zones 120 and 122 may extend into the intrinsic layer 110. The photovoltaic device 100 includes a panel of large length and width, but with a small thickness. The anneal heats the conductive contacts 104 and 114 and provides a temperature profile in the direction of the thickness of the device. While temperature remains substantially uniform at the contacts, the regions closest to the contacts 104 and 114 are annealed at the highest temperature. The temperature is reduced with depth into the structure as the diode layer (p-i-n) are less thermally conductive. The temperature and duration of the anneal can be selected to determine an optimal performance of the device by controlling the reduced defect zones 120 and 122.

The reduced defect zones 120 and 122 may be configured (sized based on depth through the thickness of the device 100) based on characteristics of the photovoltaic device or cell 100. For example, the number of layers, their dimension (e.g., thickness), their properties (e.g., materials, formation process, etc.), and other considerations are employed in determining the impact of the anneal on the device 100. The reduced defect zones 120, 122 can be configured by selecting a duration and temperature for the anneal (between about 5 minutes and about 10 minutes, at 155 to 250 degrees C.).

Figure 2:
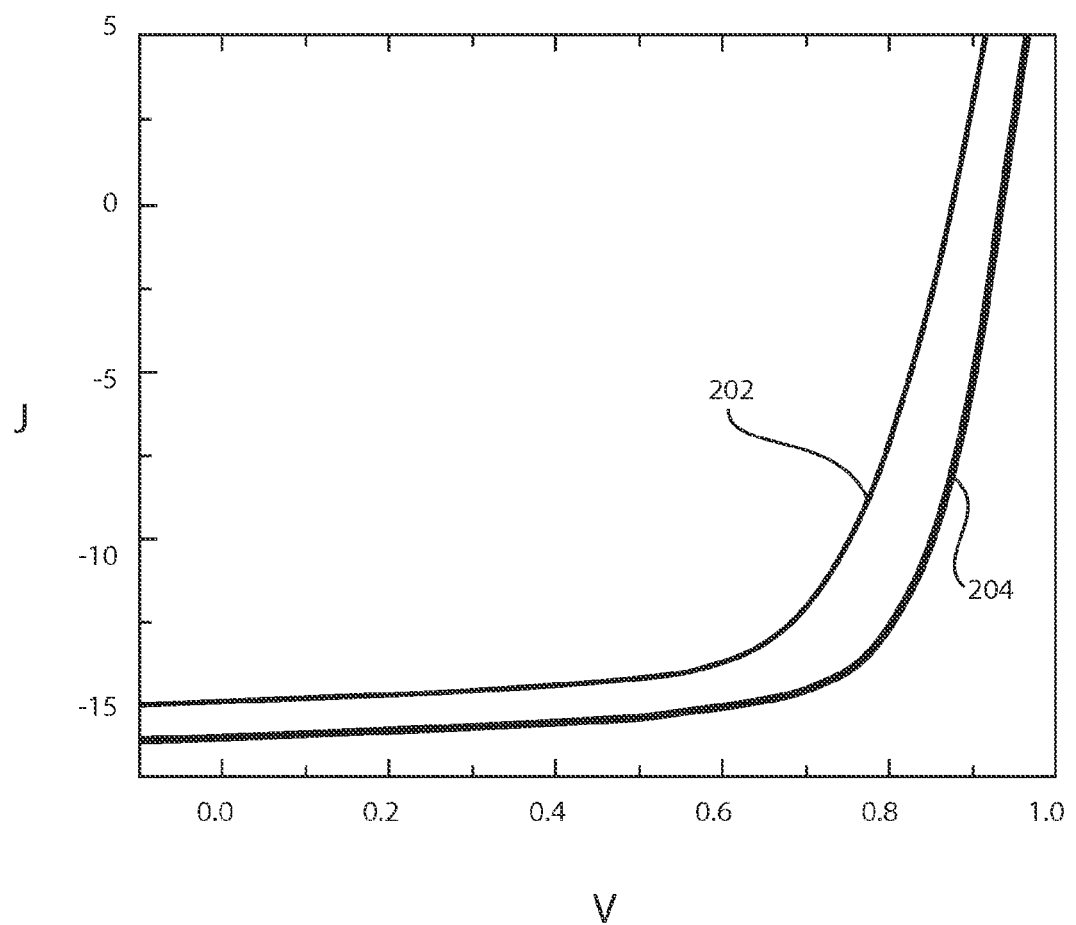
FIG. 2 depicts a graph showing current density (mA/cm$^2$) versus voltage (V) for depicting photovoltaic device performance with and without an anneal.

Referring to FIG. 2, a graph shows photovoltaic cell performance without an anneal in plot 202 and with an anneal in plot 204. The graph plots current density (J) in $mA/cm^2$ versus voltage (V) in volts for the same device with and without the anneal after contact formation. As can be seen from the graph, the plot 204 is shifted to the right which indicated improved device efficiency. The plots 202 and 204 correspond to a device that includes amorphous Si based layers processed using HDR PECVD processing. The device included p-i-n (p-type, intrinsic, n-type) layers. The anneal process was performed at 250 degrees C. for about 5 minutes. In accordance with these findings, the HDR PECVD formation followed by the RTA results in improved device efficiency. Table I shows data collected for the same cell with and without the anneal process.

TABLE I

| Type of processing | Fill Factor (FF) | Open Circuit Voltage (Voc) (mV) | Short Circuit Current (Jsc) (mA) | Efficiency (%) |
| --- | --- | --- | --- | --- |
| With anneal | 70.42 | 936.6 | 15.85 | 10.46 |
| Without anneal | 66.15 | 876.9 | 14.8 | 8.59 |

In accordance with Table I, the overall efficiency was increased in this case by almost 2%. An increase in FF from 70.42 to 66.15 (6.5%) is achieved. Open circuit voltage (Voc) improves 6.8%, and short circuit current improves 7%. Overall conversion efficiency improves by 21.7%. Cell performance may be optimized by anneal processes using specific annealing conditions. Advantageously, a fabricated device can be tested prior to anneal. Then, an appropriate anneal may be selected or tested to provide an optimized performance boost. This process can be performed without damaging the device.

In addition, large area processing refers to large scale devices having an illustrative size on the order of feet or meters, e.g., 1.5 meters by 0.6 meters. For large area deposition in manufacturing environments, devices may include solar panels. In accordance with the present principles, a photovoltaic cell or panel made in particularly useful embodiments has length and width dimensions of greater than about six inches. Useful photovoltaic cells include an integrally formed radiation absorbing area of greater than 0.25 square feet where the length and width of the cell may be varied. Low fabrication power is favored for such devices. Improvements as demonstrated in Table I result in significant monetary savings as well as time and energy savings.

Figure 3:
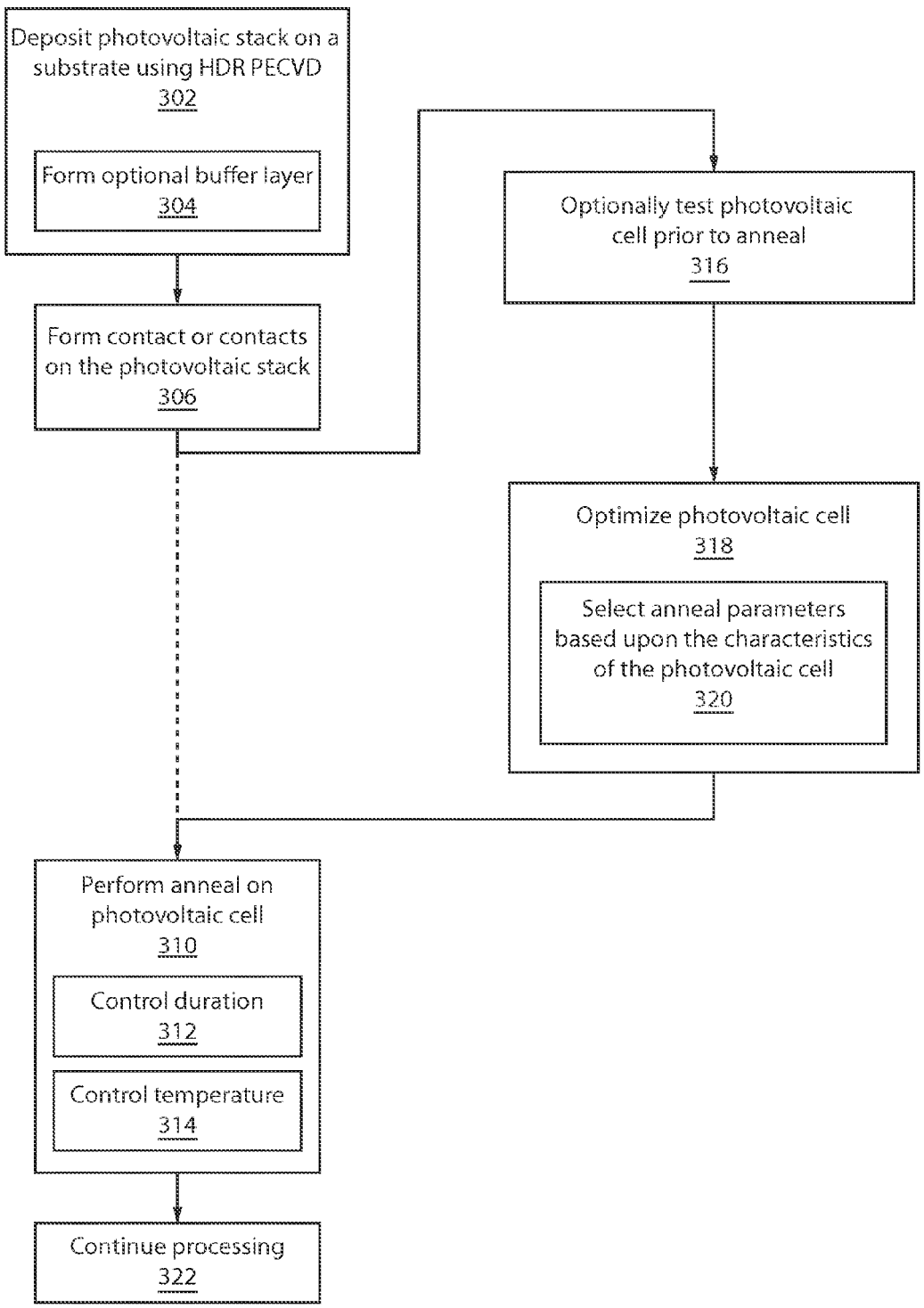
FIG. 3 is a block/flow diagram showing methods for fabricating a photovoltaic device with a high deposition rate plasma enhanced chemical vapor deposition (HDR PECVD) process and an anneal in accordance with illustrative embodiments.

Referring to FIG. 3, methods for forming a photovoltaic device are illustratively shown. It should also be noted that, in some alternative implementations, the functions noted in the blocks may occur out of the order noted in FIG. 3. For example, two blocks shown in succession may, in fact, be executed substantially concurrently, or the blocks may sometimes be executed in the reverse order, depending upon the functionality involved. It will also be noted that each block of the block diagram and/or flowchart illustration, and combinations of blocks in the block diagram and/or flowchart illustration, can be implemented by special purpose hardware-based systems that perform the specified functions or acts, or combinations of special purpose hardware and computer instructions.

In block 302, one or more layers of a photovoltaic stack are deposited on a substrate by employing a high deposition rate plasma enhanced chemical vapor deposition (HDR PECVD) process. While it is possible to form these layers, e.g., a p-type layer, an optional buffer layer, an intrinsic layer, an n-type layer, etc. by different processes, it is preferable to form these layers with the HDR PECVD process.

The HDR PECVD process preferably includes a deposition rate of 3-25 angstroms per second or greater, and is performed in a vacuum chamber under the following conditions: a vacuum pressure of between about 1 mTorr and about 90 mTorr; a power of between about 100 mW/cm$^2$ and about 10 W/cm$^2$ and a temperature between about 200 degrees C. to about 300 degrees C. The buffer layer, if employed, is formed, in block 304, between a transparent electrode formed on the substrate and a p-type layer.

In block 306, a contact or contacts are formed on the photovoltaic stack to provide a photovoltaic cell. One contact may be added when the photovoltaic stack is completed, and the other contact is preferably formed prior to formation of the photovoltaic stack, e.g., on the transparent electrode of the substrate.

In block 310, an anneal process is performed on the photovoltaic cell after the final contact is formed. The anneal is preferably performed at a temperature and duration configured to improve overall performance of the device.

In block 312, the anneal includes a duration controlled between about 5 minutes and about 10 minutes. In block 314, the anneal includes a temperature range controlled between about 155 degrees Celsius and about 250 degrees Celsius.

In block 316, the photovoltaic cell may be tested prior to the anneal to determine the parameters needed for the anneal to provide a largest improvement in operating performance.

In block 318, the photovoltaic cell is optimized. This may include selecting parameters for the anneal in block 320. The anneal parameters (e.g., duration, temperature, etc.) are selected to optimize performance of the photovoltaic cell based on characteristics of the photovoltaic cell. The characteristics of the photovoltaic cell may include materials, dimensions, processes employed for formation, etc. For example, the thickness, materials, number of layers, etc. should be considered to ensure that a reduced defect zone is created adjacent to the contacts. The reduced defect zone needs sufficient energy for the anneal to cure defects and reduce metal to semiconductor resistance. The thermal energy needs to penetrate sufficiently but only for a limited duration to ensure that better conductivity is achieved without damage to the photovoltaic stack. This may include thermal conductivity experiments and/or computations for the device.

In block 322, processing continues as needed. For example, a back reflector or back reflectors may be formed. Other structures and layers are also envisioned.

Having described preferred embodiments for high efficiency solar cells fabricated by inexpensive PECVD (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for forming a photovoltaic device, comprising:
    depositing one or more layers of a photovoltaic stack on a substrate by employing a high deposition rate plasma enhanced chemical vapor deposition (HDR PECVD) process;
    forming contacts on the photovoltaic stack to provide a photovoltaic cell;
    annealing the photovoltaic cell at a temperature and duration configured to improve overall performance by increasing the crystallinity of the photovoltaic stack in the regions of the photovoltaic stack nearest to the contacts; and
    testing the photovoltaic cell prior to the annealing and applying the annealing to optimize performance of the photovoltaic cell based on characteristics of the photovoltaic cell.

2. The method as recited in claim 1, wherein the one or more layers include a buffer layer between a transparent electrode formed on the substrate and a p-type layer of the photovoltaic stack, wherein the buffer bridges an energy gap between the transparent electrode formed on the substrate and the p-type layer of the photovoltaic stack.

3. The method as recited in claim 1, wherein the HDR PECVD process includes a deposition rate of 3 angstroms per second or greater.

4. The method as recited in claim 1, wherein the HDR PECVD process includes a vacuum pressure of between about 1 mTorr and about 90 mTorr.

5. The method as recited in claim 1, wherein annealing includes a duration of between about 5 minutes and about 10 minutes.

6. The method as recited in claim 1, wherein the characteristics of the photovoltaic cell include materials, dimensions and processes employed for formation.

7. The method as recited in claim 1, wherein the HDR PECVD process includes a power of between about 100 mW/cm$^2$ and about 10 W/cm$^2$.

8. The method as recited in claim 1, wherein the temperature includes a range of between about 155 degrees Celsius and about 250 degrees Celsius.

9. The method as recited in claim 1, wherein the photovoltaic cell includes an integrally formed radiation absorbing area of greater than 0.25 square feet.

10. A method for forming a photovoltaic device, comprising:
    depositing a p-type layer on a transparent electrode of a transparent substrate;
    depositing an intrinsic layer on the p-type layer;
    depositing an n-type layer on intrinsic layer, wherein at least the p-type layer, the intrinsic layer and the n-type layer are deposited by employing a high deposition rate plasma enhanced chemical vapor deposition (HDR PECVD) process to form a photovoltaic stack on the substrate;
    forming a contact on the n-type layer photovoltaic stack to provide a photovoltaic cell; and
    annealing the photovoltaic cell at a temperature of between about 155 and 250 degrees Celsius to improve overall performance by increasing the crystallinity of the photovoltaic stack in the regions of the photovoltaic stack nearest to the transparent electrode and the contact on the n-type layer.

11. The method as recited in claim 10, wherein the photovoltaic stack includes a buffer layer disposed between the transparent electrode and the p-type layer, wherein the buffer layer bridges an energy gap between the transparent electrode formed on the substrate and the p-type layer of the photovoltaic stack.

12. The method as recited in claim 10, wherein the HDR PECVD process includes a deposition rate of 3 angstroms per second or greater.

13. The method as recited in claim 10, wherein the HDR PECVD process includes a vacuum pressure of between about 1 mTorr and about 90 mTorr.

14. The method as recited in claim 10, wherein rapid thermal annealing includes a duration of between about 5 minutes and about 10 minutes.

15. The method as recited in claim 10, further comprising testing the photovoltaic cell prior to the annealing and applying the annealing to optimize performance of the photovoltaic cell based on characteristics of the photovoltaic cell.

16. The method as recited in claim 15, wherein the characteristics of the photovoltaic cell include materials, dimensions and processes employed for formation.

17. The method as recited in claim 10, wherein the HDR PECVD process includes a power of between about 100 mW/cm$^2$ and about 10 W/cm$^2$.

18. The method as recited in claim 10, wherein the photovoltaic cell includes an integrally formed radiation absorbing area of greater than 0.25 square feet.

19. A method for forming a photovoltaic device, comprising:
depositing a buffer layer on a transparent electrode of a transparent substrate;
depositing a p-type layer on the buffer layer;
depositing an intrinsic layer on the p-type layer;
depositing an n-type layer on the intrinsic layer, wherein at least the p-type layer, the buffer layer, the intrinsic layer and the n-type layer are deposited by employing a high deposition rate plasma enhanced chemical vapor deposition (HDR PECVD) process to form a photovoltaic stack on the substrate, the HDR PECVD process including a deposition rate of 3 angstroms per second or greater at a vacuum pressure of between about 1 mTorr and about 90 mTorr;
forming a contact on the n-type layer photovoltaic stack to provide a photovoltaic cell; and
annealing the photovoltaic cell at a temperature of between about 155 and 250 degrees Celsius for a duration of between about 5 minutes and about 10 minutes to improve overall performance by increasing the crystallinity of the photovoltaic stack in the regions of the photovoltaic stack nearest to the transparent electrode and the contact on the n-type layer.

20. The method as recited in claim 19, further comprising testing the photovoltaic cell prior to the annealing and applying the annealing to optimize performance of the photovoltaic cell based on characteristics of the photovoltaic cell.

21. The method as recited in claim 20, wherein the characteristics of the photovoltaic cell include materials, dimensions and processes employed for formation.

22. The method as recited in claim 19, wherein the HDR PECVD process includes a power of between about 100 mW/cm$^2$ and about 10 W/cm$^2$.

23. The method as recited in claim 19, wherein the photovoltaic cell includes an integrally formed radiation absorbing area of greater than 0.25 square feet.

* * * * *